United States Patent [19]

Grieser-Schmitz

[11] Patent Number: 5,798,690
[45] Date of Patent: Aug. 25, 1998

[54] MONITORING CIRCUIT FOR AN ABS WARNING LAMP

[75] Inventor: Stefan Grieser-Schmitz, Wuppertal, Germany

[73] Assignee: Varity GmbH, Koblenz, Germany

[21] Appl. No.: 795,623

[22] Filed: Feb. 6, 1997

Related U.S. Application Data

[60] Provisional application No. 60/011,347 Feb. 8, 1996.
[51] Int. Cl.$^6$ .................................................. B60Q 11/00
[52] U.S. Cl. ........................... 340/458; 340/461; 340/641; 315/77
[58] Field of Search ............................ 340/458, 641, 340/642, 461; 307/10.8; 314/9; 315/82, 77, 200, 66, 64

[56]         References Cited

U.S. PATENT DOCUMENTS

| | | | |
|---|---|---|---|
| 4,295,079 | 10/1981 | Otsuka et al. | 340/642 |
| 4,745,339 | 5/1988 | Izawa et al. | 315/82 |
| 4,965,548 | 10/1990 | Fayfield | 340/511 |
| 5,030,938 | 7/1991 | Bondzeit | 340/431 |
| 5,057,814 | 10/1991 | Onan et al. | 340/458 |
| 5,075,669 | 12/1991 | Nakadozono et al. | 340/458 |
| 5,144,282 | 9/1992 | Sutterlin et al. | 340/458 |
| 5,266,840 | 11/1993 | Leipold et al. | 340/642 |
| 5,442,257 | 8/1995 | Mitsumoto | 340/641 |
| 5,515,028 | 5/1996 | Dittmar | 340/458 |

*Primary Examiner*—Jeffery A. Hofsass
*Assistant Examiner*—Anh La
*Attorney, Agent, or Firm*—MacMillan, Sobanski & Todd, LLC

[57]         ABSTRACT

A monitoring circuit for detecting a malfunctioning warning lamp circuit includes a first device for monitoring the voltage within the warning lamp circuit and a second device for monitoring the current through the warning lamp circuit. Each of the monitoring devices has an output which is connected to a decision device. The first device generates a first output signal when the monitored voltage is greater than a predetermined voltage and a second output signal when the monitored voltage is less than the predetermined voltage. The second device generates a first output signal when a current flows through the lamp and a second output signal when there is no current flowing through the lamp. The decision device is responsive to the output signals from the monitoring devices to generate a failure signal when the warning lamp circuit malfunctions.

13 Claims, 2 Drawing Sheets

| FAULT | DRIVER | LAMP | VOLTAGE SENSE | CURRENT SENSE | XOR OUTPUT |
|---|---|---|---|---|---|
| -- | ON | ON | 1 | 1 | 0 |
| -- | OFF | OFF | 0 | 0 | 0 |
| OPEN | ON | OFF | 1 | 0 | 1 |
| OPEN | OFF | OFF | 1 | 0 | 1 |
| SHORT TO GND | ON | ON | 1 | 0 | 1 |
| SHORT TO GND | OFF | ON | 1 | 0 | 1 |
| SHORT TO B+ | ON | OFF | 0 | 1 | 1 |
| SHORT TO B+ | OFF | OFF | 0 | 0 | 0 |

FIG. 2

MONITORING CIRCUIT FOR AN ABS WARNING LAMP

CROSS REFERENCE TO RELATED APPLICATIONS

This application claims the benefit of U.S. Provisional Application No. 60/011,347, filed Feb. 8, 1996.

BACKGROUND OF THE INVENTION

This invention relates in general to anti-lock brake systems (ABS) and in particular to a monitoring circuit for an ABS warning lamp.

An Anti-lock Brake System (ABS) is often included as standard equipment on new vehicles. When actuated, the ABS is operative to control the operation of some or all of the vehicle wheel brakes. A typical ABS includes a central control valve having a control valve body. A plurality of solenoid valves are mounted within the control valve body and are connected to the vehicle hydraulic brake system. Usually, a separate hydraulic source, such as a motor driven pump, is included in the ABS for supplying hydraulic pressure to the controlled wheel brakes during an ABS braking cycle. The pump is typically included within the control valve body while the pump motor is mounted upon the exterior of the control valve body. A control module for actuating the solenoid valves and pump is mounted upon the control valve body.

The control module includes electronic components which monitor the speed and deceleration of the controlled wheels. The control module also includes electronic components which are operative to selectively actuate the solenoid valves in the control valve to cyclically relieve and reapply pressure to the controlled wheel brakes when the vehicle brakes are applied and the control module senses an impending wheel lock-up condition. The hydraulic pressure applied to the controlled brakes is adjusted to limit wheel slippage to a safe level while continuing to produce adequate brake torque to decelerate the vehicle as desired by the driver.

A typical ABS also includes a pressure differential switch which monitors the hydraulic fluid pressure within the ABS to assure that the solenoid valves are operating properly. Should failure of a solenoid valve be detected, the pressure differential switch generates a brake component failure signal which is transmitted to the control module. The control module is responsive to the failure signal to illuminate a brake failure warning lamp which is mounted upon the vehicle dashboard. The brake failure warning lamp provides a visual message to the vehicle operator to obtain service for the ABS. It also is known to program the ABS control module to perform diagnostic tests upon the ABS when the vehicle is started. Failure of any of the diagnostic tests will cause the control module to illuminate the brake failure warning lamp.

SUMMARY

The present invention relates to a circuit for monitoring a brake failure warning lamp circuit and generating a failure signal should the warning lamp circuit malfunction.

As described above, it is known to provide a brake failure warning lamp in an ABS equipped vehicle which is illuminated if the ABS malfunctions. However, if the brake warning lamp or its associated warning lamp circuit should fail, the warning function would not be available. Accordingly, it would be desirable to monitor the brake warning lamp and circuit, or driver, for failure.

The present invention contemplates a monitoring circuit which includes a first device for monitoring a condition of the warning lamp driver. The first monitoring device has an output terminal and is responsive to the condition of the warning lamp driver to generate one of a first and a second lamp driver signals at the output terminal.

The monitoring circuit also includes a second device for monitoring a condition of the warning lamp. The second monitoring device has an output terminal and is responsive to the condition of the warning lamp to generate one of a first and a second lamp signals at the output terminal.

The monitoring circuit further includes a decision device having a first input terminal connected to the output terminal of the first monitoring device and a second input terminal connected to the output terminal of the second monitoring device. The decision device further has an output terminal adapted to be connected to a warning device. The decision device is responsive to the lamp driver and lamp signals at the first and second input terminals to generate an output signal at the output terminal.

The invention further contemplates that the first monitoring device is responsive to the voltage across the lamp driver to generate the first lamp driver signal when the lamp driver voltage is greater than a predetermined voltage and to generate the second driver signal when the lamp driver voltage is less than the predetermined voltage.

The invention also contemplates that the second monitoring device is responsive to the current through the warning lamp to generate the first lamp signal when a current flows through the lamp and to generate the second lamp signal when no current is flowing through the lamp.

Various objects and advantages of this invention will become apparent to those skilled in the art from the following detailed description of the preferred embodiment, when read in light of the accompanying drawings.

BRIEF DESCRIPTION OF THE DRAWINGS

FIG. 2 is a truth table for the monitoring circuit shown in FIG. 1.

DETAILED DESCRIPTION OF THE PREFERRED EMBODIMENT

Figure 1:
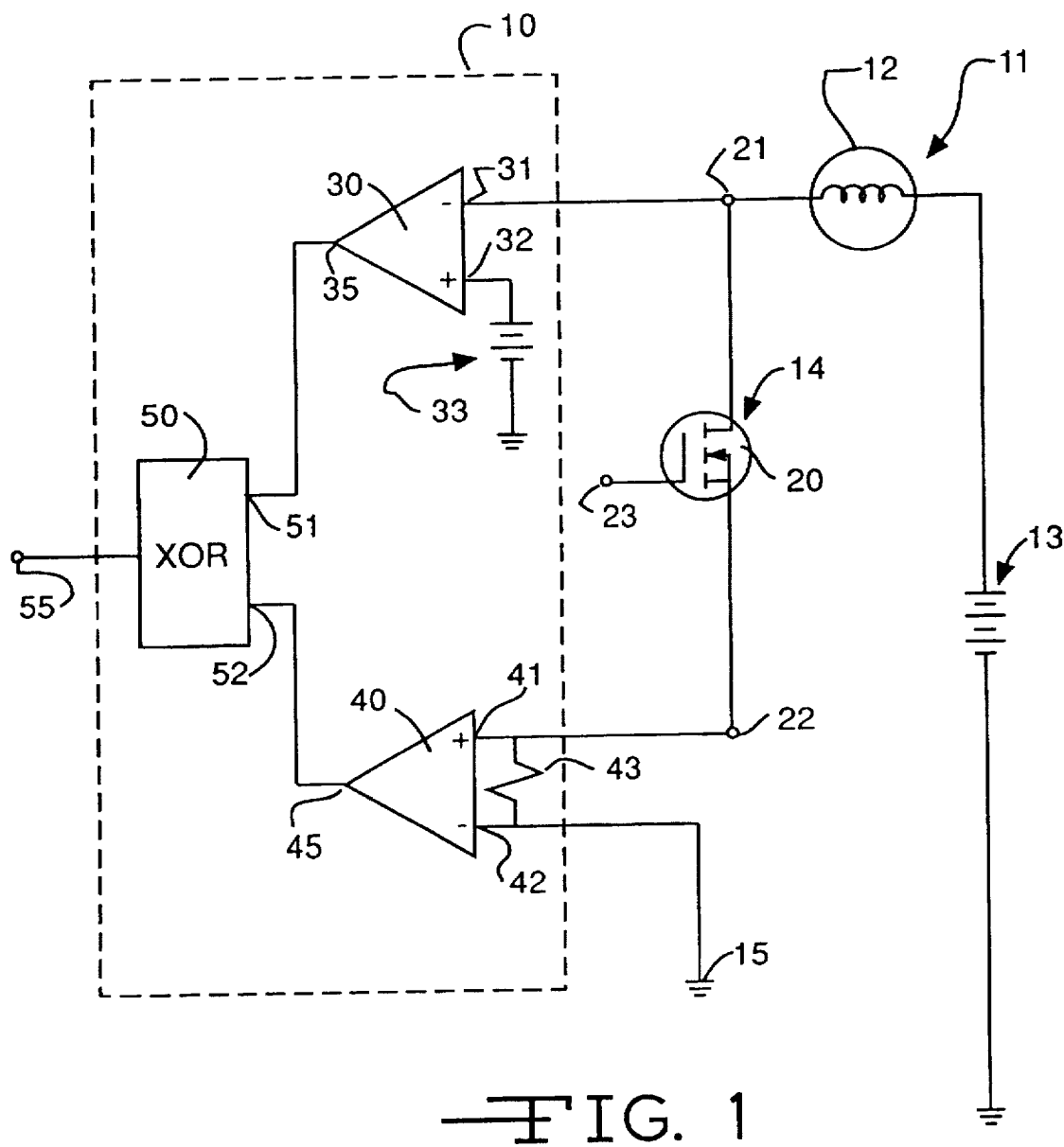
FIG. 1 is a schematic diagram of a monitoring circuit for an ABS warning lamp in accordance with the invention.

Referring now to the drawings, there is illustrated in FIG. 1 a schematic drawing of a monitoring circuit 10 for an ABS warning lamp in accordance with the invention. Also shown in FIG. 1 is a warning lamp circuit 11 which is of conventional design. The warning lamp circuit 11 includes a warning lamp 12 which is typically mounted in the vehicle dashboard. The warning lamp 12 is connected between a power supply 13, such as the vehicle battery, and a lamp driver 14. The lamp driver 14 is usually an electronic switch which is operative upon receipt of a brake component failure signal to connect the warning lamp 12 to ground 15. In the preferred embodiment of the invention, the lamp driver 14 is an n-channel MOSFET 20, as shown in FIG. 1. However, it will be appreciated that other electronic or mechanical devices may be used as the lamp driver 14.

The MOSFET 20, which is usually included in an ABS control module (not shown), has a drain terminal 21 connected to the warning lamp 12 and, in the conventional warning lamp circuit (not shown), has a source terminal 22 connected through the monitoring circuit 10 to ground 15 to ground. The MOSFET 20 also has a gate terminal 23 which is connected to the control module electronics (not shown). The MOSFET 20 is an electronic device which is in a non-conducting, or "off", state with no current flow between the drain and source terminals 21 and 22 when the gate terminal 23 is at ground potential. Upon application of a positive potential to the gate terminal 23, the MOSFET 20 switches to a conducting, or "on", state, allowing current to flow between the drain and source terminals 21 and 22.

During normal ABS operation, the MOSFET gate terminal 23 is held at ground potential, and the off state of the MOSFET 20 blocks any current flow through the warning lamp 12. Upon detection of a fault in the ABS, the control module electronics applies a brake component failure signal, which, for the circuit illustrated is a positive voltage, to the MOSFET gate terminal 23. The MOSFET 20 is responsive to the brake component failure signal to switch to its on state, allowing current to flow from the power supply 13, through the warning lamp 12 and, as will be explained below, the monitoring circuit 10 to ground 15. This illuminates the warning lamp 12, which remains illuminated as long as there is a failure signal present at the MOSFET gate terminal 23.

The monitoring circuit 10 includes a voltage sensing operational amplifier 30 for monitoring the voltage across the lamp driver 14. The voltage sensing operational amplifier 30 has a negative input terminal 31 connected to the MOSFET drain terminal 21 and a positive input terminal 32 connected to a reference voltage supply 33. The reference voltage supply 33 has a predetermined voltage value which is selected to be less than the output voltage of the power supply 13, but greater than the voltage at the MOSFET drain terminal 21 when the warning lamp 12 is illuminated and the warning light circuit 11 is operating properly.

The voltage sensing operational amplifier 30 also has an output terminal 35. When the voltage at the MOSFET drain terminal 21 is greater than the reference voltage, the operational amplifier 30 is off and the output terminal 35 is at ground potential. If the drain voltage drops below the reference voltage, a positive voltage difference appears between the operational amplifier input terminals 31 and 32 and the operational amplifier 30 turns on, which causes a positive voltage, typically 5 volts, to appear at the output terminal 35.

The monitoring circuit 10 also includes a current sensing operational amplifier 40 for monitoring the current flowing through the warning lamp circuit 11. The current sensing operational amplifier 40 has a positive input terminal 41 connected to the MOSFET source terminal 22 and a negative input terminal 42 connected to the ground 15. A current sensing resistor 43 is connected between the operational amplifier input terminals 41 and 42. The current sensing resistor 43 has a small value, typically a few ohms. As shown in FIG. 1, the warning lamp current normally flows through the current sensing resistor 43.

The current sensing operational amplifier 40 also has an output terminal 45. The voltage at the operational amplifier output terminal 45 is a function of the lamp current. When the MOSFET 20 is in its off state, the lamp current is zero and there is no voltage across the sensing resistor 43. Accordingly, the current sensing operational amplifier 40 is off and the output terminal 45 is at ground potential. When the lamp driver 14 is in its conducting state, a lamp current flows through the sensing resistor 43 causing a voltage to appear across the operational amplifier input terminals 41 and 42. Accordingly, the operational amplifier 40 turns on, which causes a positive voltage, typically 5 volts, to appear at the output terminal 45.

The monitoring circuit 10 further includes an exclusive OR, or XOR, gate 50. The XOR gate 50 has first and second input terminals, 51 and 52, respectively. The first input terminal 51 is connected to the output terminal 35 of the voltage sensing operational amplifier 30 while the second input terminal 52 is connected to the output terminal 45 of the current sensing operational amplifier 40. The XOR gate 50 also has an output terminal 55 which is connected to a vehicle status monitor, such as a vehicle diagnostic computer and/or another warning light (not shown). The XOR gate 50 is operative to generate a positive voltage, typically 5 volts, as a warning light failure signal when the input terminals 51 and 52 are at different potentials. When the input terminals 51 and 52 are at the same potential, which, as described above, can be either zero or 5 volts, the output terminal 55 goes to ground potential.

The operation of the warning lamp monitoring circuit 10 will now be described. When the MOSFET 20 and lamp 12 are functioning properly, the lamp 12 will be illuminated when the MOSFET 20 is in its on state and the lamp 12 will not be illuminated when the MOSFET 20 is in its off state. As illustrated in the first line of the truth table shown in FIG. 2, when both the lamp 12 and MOSFET 20 are on, there is a current flowing through the warning lamp circuit 11 and the voltage at the drain terminal 21 drops below the reference voltage. Also, a voltage appears across the current sensing resistor 43. As a result, both operational amplifiers 30 and 40 turn on and apply five volts to both of the input terminals 51 and 52 of the XOR gate 50. The XOR gate 50 is responsive to both of the input voltages being the same to hold the XOR gate output terminal at ground potential.

Similarly, as shown in the second line of the truth table in FIG. 2, when both the lamp 12 and MOSFET 20 are off, there is no current flowing through the warning lamp circuit 11. Accordingly, the voltage at the drain terminal 21 is approximately equal to the output voltage of the power supply 13, which is greater than the reference voltage. Also, there is no voltage across the current sensing resistor 43. As a result, both operational amplifiers 30 and 40 turn off and hold both of the input terminals 51 and 52 of the XOR gate 50 at ground potential. The XOR gate 50 is responsive to the two input voltages being the same to continue to hold the XOR gate output terminal at ground potential, as shown in the second line of the truth table.

A potential fault in the warning lamp circuit 11 is an open circuit occurring at the drain terminal 21 of the MOSFET 20. For example, such a fault could occur if the warning lamp 12 burned out. With an open circuit between the drain terminal 21 and the power supply 13, there would be no voltage at the negative input terminal 31 of the voltage sensing operational amplifier 30. Accordingly, the voltage sensing operational amplifier 30 would be on and would apply 5 volts to the first input terminal 51 of the XOR gate 50. This would occur when the MOSFET 20 is in either its on state or its off state, as shown in lines 3 and 4 in the truth table. Because there is an open circuit, no current would flow through the current sensing resistor 43. Accordingly, the current sensing operational amplifier 30 would be off and would hold the second input terminal 52 of the XOR gate 50 at ground potential. Thus, the input voltages to the XOR gate 50 are different and the XOR gate 50 will generate a 5 volt warning light failure signal at its output terminal 55. As described above, the warning light failure signal would be applied to a vehicle status monitor, such as a vehicle diagnostic computer and/or another warning light.

Another potential fault which could develop in the warning lamp circuit 11 is a short from the MOSFET drain terminal 21 to ground 15. Such a fault could, for example, result from a wiring fault and would cause the lamp 12 to be continually illuminated while bypassing the current sensing resistor 43. Accordingly, the voltage at the MOSFET drain terminal 21 would be effectively zero, causing the voltage sensing operational amplifier 30 to turn on and apply 5 volts to the first input terminal 51 of the XOR gate 50. This would occur whether the MOSFET 20 were in either its on state or its off state, as shown in lines 5 and 6 in the truth table. Additionally, because the current sensing resistor 43 is bypassed, the current sensing operational amplifier 40 is shut off, holding the second input terminal 52 of the XOR gate 50 to ground potential. As a result, the inputs to the XOR gate 50 are different and the XOR gate 50 will generate a 5 volt warning light failure signal at its output terminal 55, as shown in lines 5 and 6 in the truth table.

A third potential fault in the warning lamp circuit 11 is the occurrence of a short from the voltage supply 13 to the drain terminal 21, as could occur with short in the wiring or due to moisture in the lamp socket. Such a fault would provide a current path which bypasses the lamp 12 and connects the drain terminal 21 of the lamp driver 14 directly to the power supply 13. Because the power supply voltage is greater than the reference voltage, the voltage sensing operational amplifier 30 would be off and would hold the first input terminal 51 of the XOR gate 50 at ground potential. If the MOSFET 21 is in its on state, current will flow from the drain terminal 21 through the sensing resistor 43, causing the current sensing operational amplifier 40 to turn on and apply 5 volts to the second input terminal 52 of the XOR gate 50. Accordingly, as shown in line 7 of the truth table, the XOR gate 50 will generate a 5 volt warning light failure signal at its output terminal 55.

Conversely, if the MOSFET 21 is in its off state, current will not flow through the current sensing resistor 43, causing the current sensing operational amplifier 40 to shut off. The voltage sensing operational amplifier will remain off and both input terminals of the XOR gate 50 will be at ground potential, as shown in line 8 of the truth table. Accordingly, the output terminal 55 of the XOR gate 50 will be at ground potential. Since both input voltages to the XOR gate 50 are the same, the XOR gate output terminal 55 will be held at ground potential. However, these conditions are the same as shown in the second line of the truth table for correct operation. Therefore, the combination of a short from the power supply 13 to the drain terminal 21 does not generate a warning light failure signal when the MOSFET 20 is off.

It is apparent from the above description that the monitoring circuit 10 continuously monitors the condition of the warning lamp 12 and circuit 11, including periods when the ABS is not operative.

While the preferred embodiment of the invention has been illustrated and described in terms of monitoring an ABS warning lamp and associated circuit, it will be appreciated that the invention also can be utilized to monitor other lamps and lamp circuits.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An apparatus for monitoring a warning lamp circuit which includes a warning lamp electrically connected to a warning lamp driver, the monitoring apparatus comprising:

a first monitoring device having an input terminal adapted to be connected to the warning lamp, said first monitoring device also having an output terminal, said first monitoring device being responsive to a first condition of the warning lamp circuit to generate one of a first and a second output signals at said output terminal of said first monitoring device;

a second monitoring device having an input terminal adapted to be connected to the warning lamp driver, said second monitoring device as having an output terminal, said second monitoring device being responsive to a second condition of the warning lamp circuit to generate one of a first and a second output signals at said output terminal of said second monitoring device; and a decision device having a first input terminal connected to said output terminal of said first monitoring device and a second input terminal connected to said output terminal of said second monitoring device, said decision device further having an output terminal adapted to be connected to a warning device, said decision device being responsive to said first and second monitoring device output signals at said first and second input terminals to generate an output signal at said decision device output terminal.

2. The apparatus according to claim 1 wherein said decision device is operative to generate said output signal at said output terminal of said decision device when both of said first and second input terminals of said decision device are receiving different signals.

3. The apparatus according to claim 2 wherein said decision device includes an exclusive OR gate.

4. The apparatus according to claim 2 wherein said first monitoring device is responsive to the voltage across the lamp driver to generate one of said first and second output signals at said output terminal, said first monitoring device generating said first output signal when the lamp driver voltage is greater than a predetermined voltage and said first monitoring device generating said second output signal when the lamp driver voltage is less than said predetermined voltage.

5. The apparatus according to claim 4 wherein said first monitoring device includes an operational amplifier, said operational amplifier having a negative input terminal adapted to be connected between the warning lamp and the warning lamp driver, said operational amplifier having a positive terminal connected to a supply of a predetermined voltage, said predetermined voltage being less than the voltage supplied to the warning lamp and greater than the voltage across the lamp driver.

6. The apparatus according to claim 4 wherein said second monitoring device is responsive to the current through the warning lamp to generate one of said first and second output signals at said output terminal, said device generating said first output signal when a current flows through the lamp and said device generating said second output signal when no current is flowing through the lamp.

7. The apparatus according to claim 6 wherein said second monitoring device includes a current sensing resistor connected between the lamp driver and circuit ground and an operational amplifier having a positive input terminal connected to an end of said resistor which is connected to the lamp driver and a negative input terminal which is connected to said circuit ground.

8. The apparatus according to claim 6 wherein the lamp driver includes an electronic switch.

9. The apparatus according to claim 8 wherein the apparatus is included in an anti-lock brake system.

10. The apparatus according to claim 4 wherein the lamp driver includes an electronic switch.

11. The apparatus according to claim 10 wherein the apparatus is included in an anti-lock brake system.

12. The apparatus according to claim 2 wherein said first monitoring device includes a first operational amplifier, said first operational amplifier having a negative input terminal adapted to be connected between the warning lamp and the warning lamp driver, said first operational amplifier also having a positive input terminal connected to a supply of a predetermined voltage, said predetermined voltage being less than the voltage supplied to the warning lamp and greater than the voltage across the lamp driver, and further wherein said second monitoring device includes a current sensing resistor having a first end connected between the lamp driver and a second end connected to circuit ground, said second monitoring device also including a second operational amplifier having a positive input terminal connected to said first end of said current sensing resistor and a negative input terminal connected to said circuit ground.

13. The apparatus according to claim 12 wherein said decision device includes an exclusive OR gate.

* * * * *

UNITED STATES PATENT AND TRADEMARK OFFICE
CERTIFICATE OF CORRECTION

PATENT NO. : 5,798,690
DATED : August 25, 1998
INVENTOR(S) : Stefan Grieser-Schmitz It is certified that error appears in the above-identified patent and that said Letters Patent is hereby corrected as shown below:

Column 6, Claim 1, Line 10: after "monitoring device" change "as" to -- also --.

Signed and Sealed this

First Day of December, 1998

Attest:

Attesting Officer

BRUCE LEHMAN

Commissioner of Patents and Trademarks